United States Patent
Anderson et al.

(10) Patent No.: US 6,947,275 B1
(45) Date of Patent: Sep. 20, 2005

(54) FIN CAPACITOR

(75) Inventors: Brent A Anderson, Jericho, VT (US); Andres Bryant, Essex Junction, VT (US); Edward J. Nowak, Essex Junction, VT (US); Jed H. Rankin, Richmond, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/711,975

(22) Filed: Oct. 18, 2004

(51) Int. Cl.$^7$ .................. H01G 4/005; H01G 4/06; H01L 27/108
(52) U.S. Cl. .............. 361/303; 361/311; 29/25.42; 257/301; 438/286
(58) Field of Search ................ 361/303–305, 361/306.1, 311; 257/301, 303; 438/25.42, 438/386–388

(56) References Cited

U.S. PATENT DOCUMENTS

| | | | |
|---|---|---|---|
| 5,796,573 A * | 8/1998 | Kotecki et al. | 361/321.5 |
| 6,002,575 A * | 12/1999 | Kotecki et al. | 361/311 |
| 6,642,090 B1 | 11/2003 | Fried et al. | |
| 6,664,582 B2 | 12/2003 | Fried et al. | |
| 2002/0020866 A1 * | 2/2002 | Lee et al. | 257/301 |
| 2002/0163026 A1 * | 11/2002 | Park | 257/301 |
| 2003/0102497 A1 | 6/2003 | Fried, et al | |
| 2003/0178670 A1 | 9/2003 | Fried, et al | |
| 2003/0193058 A1 | 10/2003 | Fried, et al | |
| 2003/0197194 A1 | 10/2003 | Fried, et al | |
| 2004/0175492 A1 * | 9/2004 | Won et al. | 427/96.1 |

* cited by examiner

Primary Examiner—Eric W. Thomas
(74) Attorney, Agent, or Firm—McGinn & Gibb, PLLC; William D. Sabo, Esq.

(57) ABSTRACT

Disclosed is a capacitor structure and method for forming the same. This structure has a conductive substrate, conductive fins extending above the substrate, and trenches extending into the substrate. These trenches are positioned between locations where the fins extend above the substrate. The invention includes an insulator in the trenches and covering the fins. This insulator separates the substrate and fins from a conductive top plate that covers the fins and fills the trenches. A bottom plate contact electrically connects the fins and the substrate such that the fins and the substrate comprise a bottom plate of the capacitor structure.

29 Claims, 14 Drawing Sheets

FIN CAPACITOR

BACKGROUND OF THE INVENTION

1. Field of the Invention

The invention generally relates to a capacitor structure and method for forming the same and more particularly to a capacitor structure that has a conductive substrate, conductive fins extending above the substrate, and trenches extending into the substrate.

2. Description of the Related Art

Capacitors are one of the fundamental components in today's electronic devices and operate by storing a charge. For example, capacitors are often used in dynamic random access memory (DRAM) and other similar devices. One type of common capacitor uses an upper plate and a lower plate that are separated by an insulator. The invention described below provides a new type of capacitor that is substantially smaller, faster, and less-expensive to manufacture than conventional capacitors.

SUMMARY OF THE INVENTION

Disclosed is a capacitor structure and method for forming the same. This structure has a conductive substrate, conductive fins extending above the substrate, and trenches extending into the substrate. These trenches are positioned between locations where the fins extend above the substrate. The invention includes an insulator in the trenches and covering the fins. This insulator separates the substrate and fins from a conductive top plate that covers the fins and fills the trenches. A bottom plate contact electrically connects the fins and the substrate such that the fins and the substrate comprise a bottom plate of the capacitor structure.

In one embodiment, the fins and the substrate act as the bottom plate of the capacitor. In a second embodiment, only the substrate acts as the bottom plate of the capacitor and the fins are electrically isolated from the substrate and from the top plate of the capacitor. In another embodiment, the fins are used to pattern the trenches in the substrate.

The invention can be formed in any type of common integrated structure, such as in the bulk portion of the integrated chip substrate or in a silicon-on-insulator (SOI) type structure. In the SOI structure, the fins extend from the insulator layer that covers the substrate and can include conductive spacers on the fins that electrically connect the fins to the substrate. The insulator that covers the fins and lines the trenches can be separated by the SOI insulator layer and therefore this insulator comprises a first insulator portion lining the trenches and a second insulator portion covering the fins. Also, the bottom plate contact is insulated from the top plate.

This structure is formed using one or more methods that pattern the conductive fins above the conductive substrate (e.g., on the doped bulk substrate or on the insulator layer of an SOI structure). The invention then forms trenches to extend into the substrate between locations where the fins extend above the substrate. One or more insulators are then formed in the trenches and on the fins. The conductive top plate is then formed on the fins and to fill the trenches. The bottom plate can be formed at the same time (or later) and the bottom plate contact electrically connects the fins and the substrate to form a bottom plate of the capacitor structure. In SOI structures, the invention can also form conductive spacers on the fins to electrically connect the fins to the substrate. When forming the fins, the invention patterns an insulating mask on a conductive layer and then patterns the conductive fins through the insulating mask. The mask remains as a permanent part of the structure and helps to insulate the fins from the overlying top plate.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
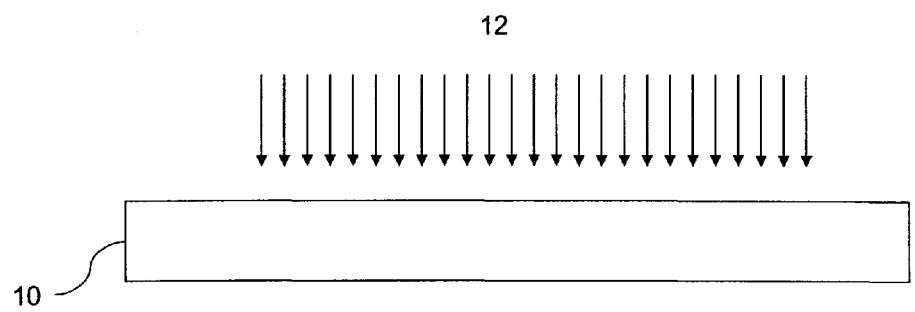
FIG. 1 is a schematic cross-sectional diagram of a partially completed capacitor according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 15:
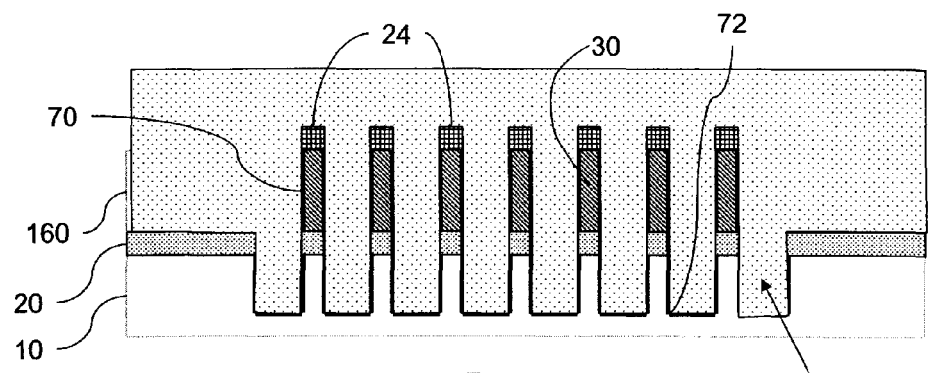
FIG. 15 is a schematic cross-sectional diagram of a partially completed capacitor according to the invention.
Figure 16:
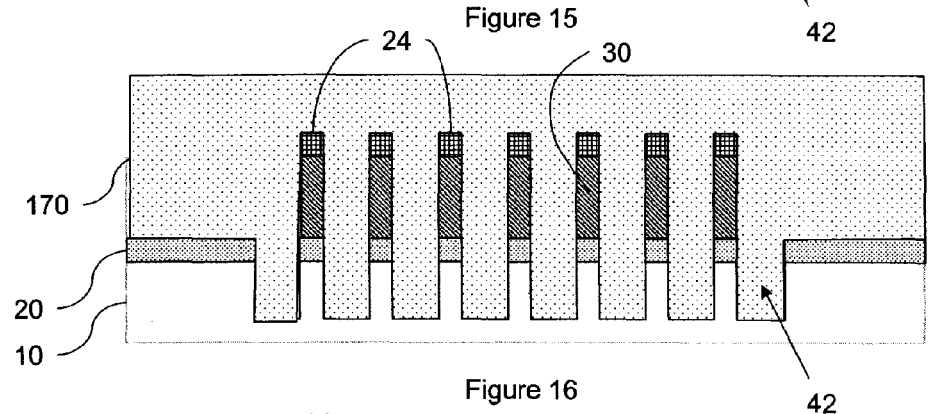
FIG. 16 is a schematic cross-sectional diagram of a partially completed capacitor according to the invention.
Figure 17:
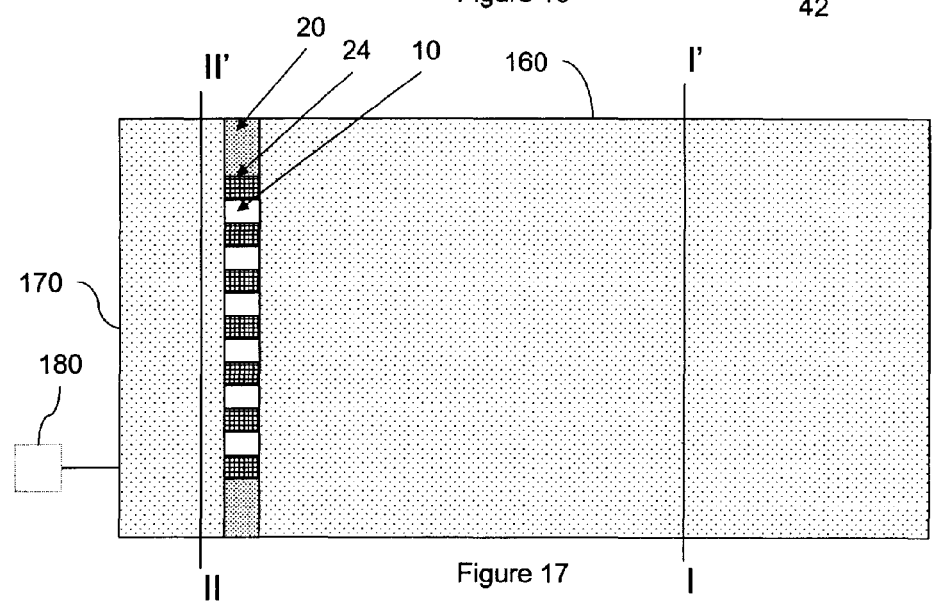
FIG. 17 is a schematic top-view diagram of a partially completed capacitor according to the invention.
Figure 18:
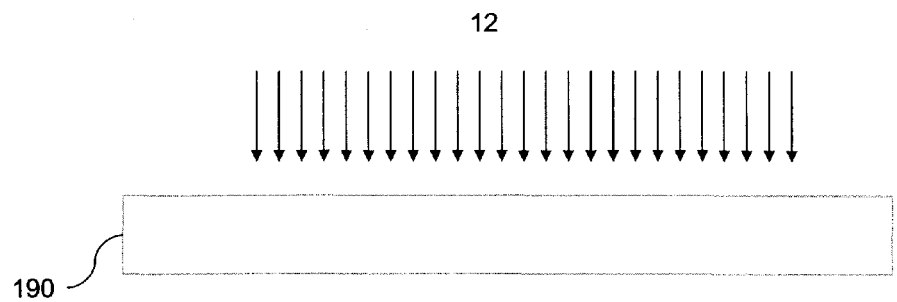
FIG. 18 is a schematic cross-sectional diagram of a partially completed capacitor according to the invention.
Figure 19:
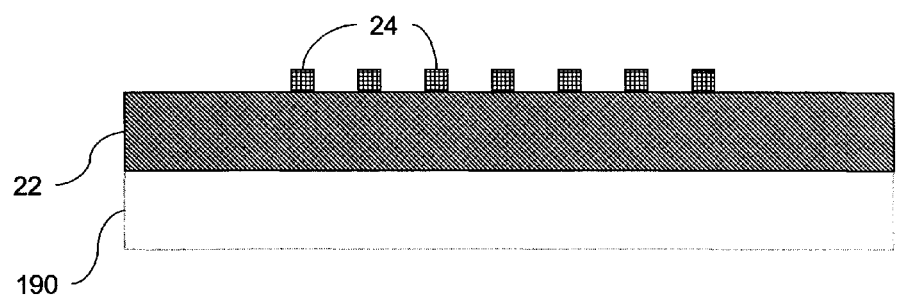
FIG. 19 is a schematic cross-sectional diagram of a partially completed capacitor according to the invention.
Figure 20:
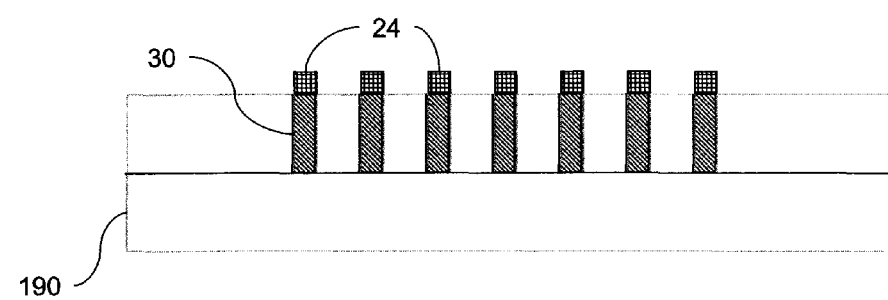
FIG. 20 is a schematic cross-sectional diagram of a partially completed capacitor according to the invention.

As mentioned above, the invention provides a new type of capacitor (e.g., memory capacitor such as a DRAM capacitor) that is substantially smaller, faster, and less-expensive to manufacture than conventional capacitors. In addition, the invention offers a substantial increase in capacitor surface area, which dramatically increases the capacitance of the capacitor. One example of the inventive structure is shown in FIGS. 15–17. FIGS. 1–17 (discussed in greater detail below) illustrate one methodology for forming this inventive structure. FIGS. 15 and 16 are cross-sectional views and FIG. 17 is a top-view. FIG. 15 is a cross-sectional view drawn along line I–I' in FIG. 17, while FIG. 16 is a cross-sectional view drawn along line II–II' in FIG. 17.

The structure shown in FIGS. 15–17 has a conductive substrate 10, conductive fins 30 extending above the substrate 10, and trenches 42 extending into the substrate 10. These trenches 42 are positioned between locations where the fins 30 extend above the substrate 10. The invention includes an insulators 70, 72 in the trenches 42 and covering the fins 30. This insulators 70, 72 separates the substrate 10 and fins 30 from a conductive top plate 160 that covers the fins 30 and fills the trenches 42. A bottom plate contact 170 electrically connects the fins 30 and the substrate 10 such that the fins 30 and the substrate 10 comprise a bottom plate of the capacitor structure.

More specifically, this process begins in FIG. 1 where a substrate 10 is implanted with an impurity 12. This impurity 12 can be any type of well-known impurity that changes the substrate 10 into a conductor. For example, the impurity 12 can comprise boron, phosphorus, arsenic, or other similar impurities. As would be understood by one ordinarily skilled in the art, the actual impurity and impurity concentrations used will vary depending upon the material makeup of the substrate. Alternatively, rather than implanting an impurity into a substrate, a conductive substrate can be formed, thereby eliminating the need to implant an impurity. However, by implanting an impurity, the invention can be used with a broader variety of devices, especially if only a portion of the substrate 10 is transformed into a conductor. By masking the substrate so that only portions of the substrate where the inventive capacitors will be formed are made conductive, other portions of the substrate can remain as insulators to be used with other types of devices. Well-known masking techniques can be used to distinguish which regions of the substrate 10 will become conductive and will be used for the inventive capacitor structure.

Figure 2:
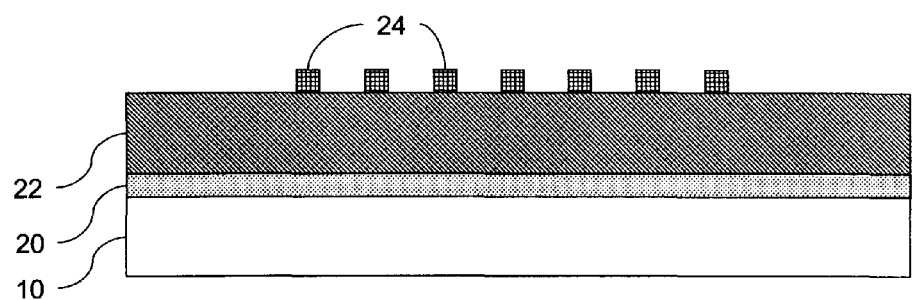
FIG. 2 is a schematic cross-sectional diagram of a partially completed capacitor according to the invention.

In FIG. 2, an insulator 20 such as an oxide, nitride, etc. is deposited over the substrate 10 and a conductive layer 22 is formed over the insulator 20. In one embodiment, the conductive layer 22 comprises polysilicon (or doped silicon). To the contrary, the conductor 22 can comprise any well-known conductor, including metals, alloys, conductively doped material, etc. An insulating mask 24 is patterned over the conductive layer 22 using any well-known patterning techniques such as photolithographic techniques. In the preferred embodiment the conductive layer 22 comprises doped silicon, formed over the insulator 20 by one of the well-known Silicon-On-insulator techniques, such as Bond-and-Etch-Back, or SIMOX.

Figure 3:
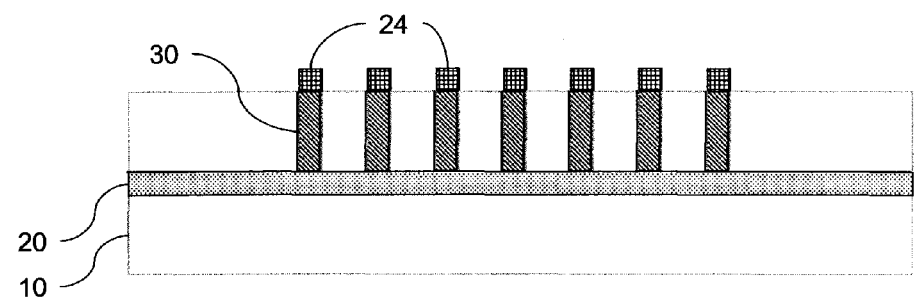
FIG. 3 is a schematic cross-sectional diagram of a partially completed capacitor according to the invention.

In FIG. 3, the mask 24 is used to pattern the conductor 22 into conductive fins 30. For example, a directional etching process (or any well-known material removal process) can be utilized to pattern the conductor layer 22 into the fins 30. Next, as shown in FIG. 4, the same material removal process can be continued, or an additional material removal processes can be utilized to pattern the insulator 20 and substrate 10 to form the trenches 42 shown in FIG. 4.

Figure 4:
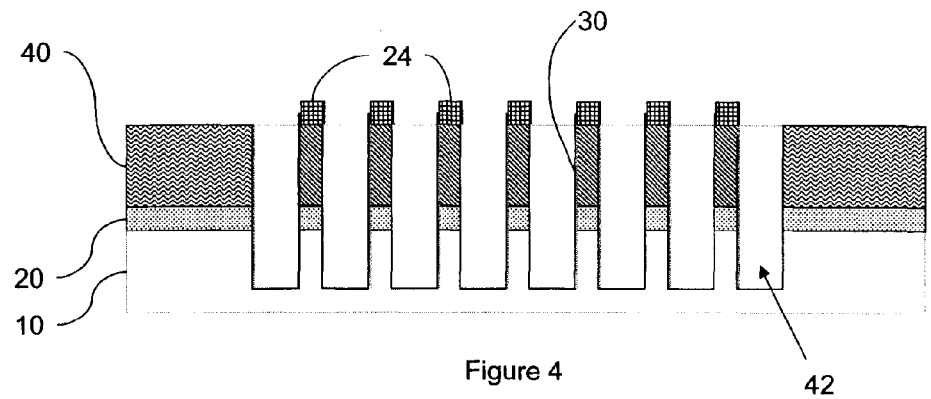
FIG. 4 is a schematic cross-sectional diagram of a partially completed capacitor according to the invention.
Figure 5:
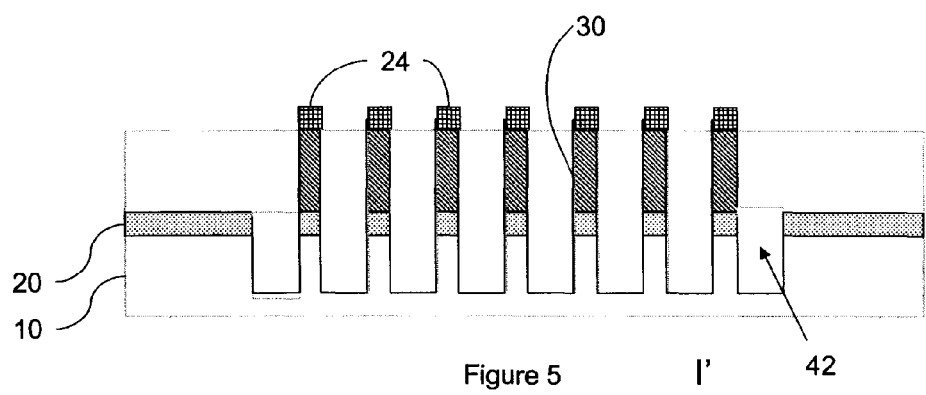
FIG. 5 is a schematic cross-sectional diagram of a partially completed capacitor according to the invention.
Figure 6:
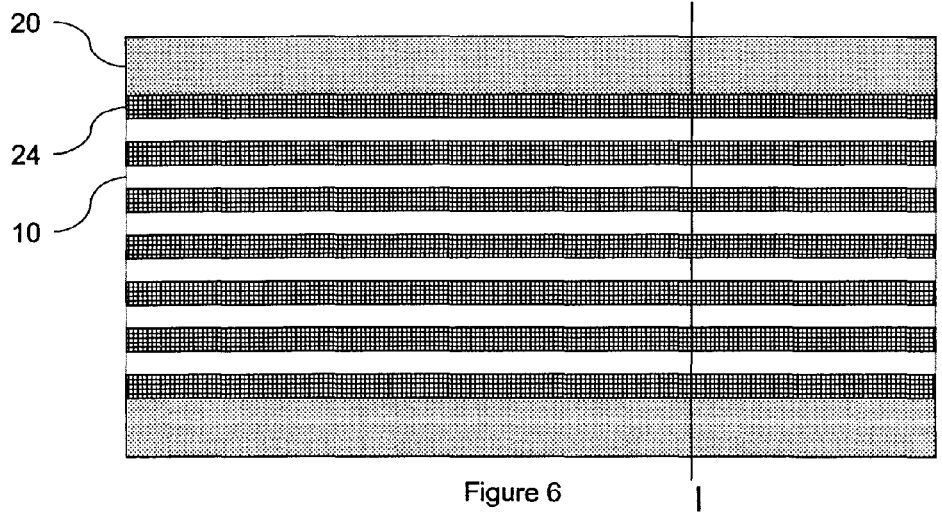
FIG. 6 is a schematic top-view diagram of a partially completed capacitor according to the invention.

Note that in FIG. 4 an additional mask 40 is utilized to protect the areas of the insulator layer 20 that are not to be patterned. In FIG. 5, the additional mask 40 is removed; however, the insulating mask 24 remains above the fins 30 and will remain in the final structure to insulate the fins 30 from the overlying top plate 160. FIG. 6 illustrates a top-view of the structure shown in FIG. 5, where the structure in FIG. 5 is a cross-sectional view along line I–I'.

Figure 7:
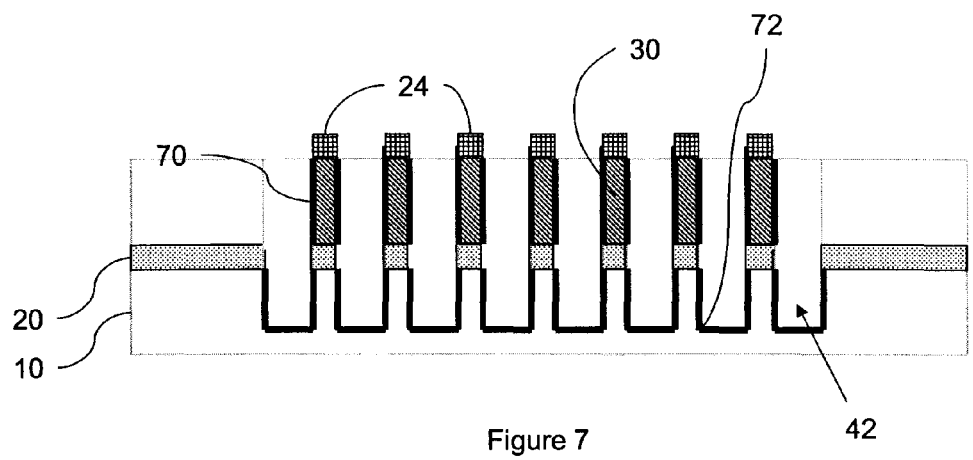
FIG. 7 is a schematic cross-sectional diagram of a partially completed capacitor according to the invention.
Figure 8:
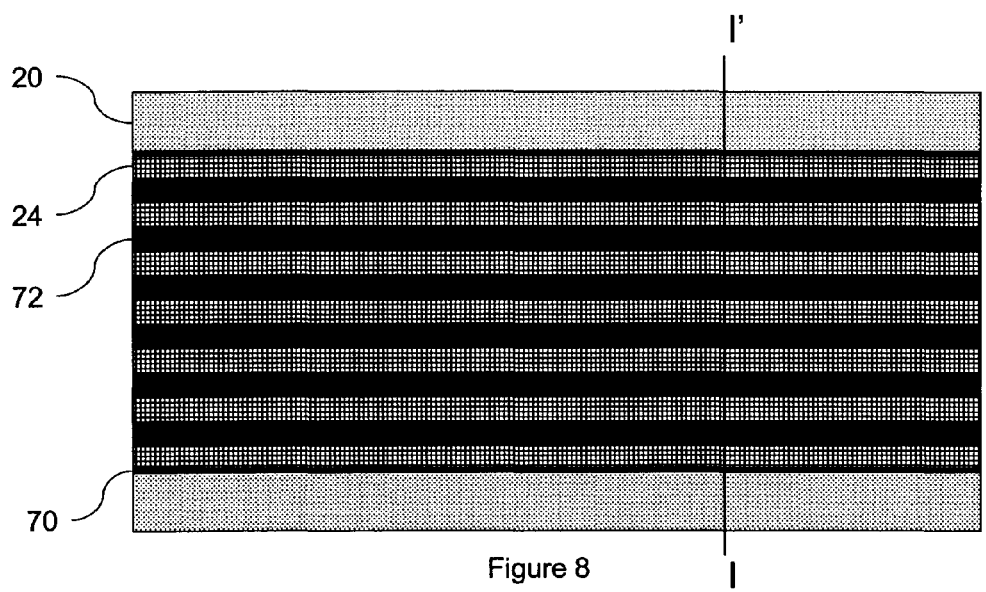
FIG. 8 is a schematic top-view diagram of a partially completed capacitor according to the invention.

In FIG. 7, insulators 70, 72 are formed along the sidewalls of the fins 30 and along the trenches 42. These insulators 70, 72 can be the same insulator or different insulators, depending upon the specific design and materials being utilized. The insulators 70, 72 can be formed in a single step or multiple steps, again depending upon the specifics of the design in question. For example, the insulators 70, 72 can be an oxide that is grown upon the fins 30 and in the trenches 42, or the insulators 70, 72 can be deposited conformally over the structure. Again, FIG. 8 is a top-view of FIG. 7, with FIG. 7 being the cross-section shown along line I–I'.

Figure 9:
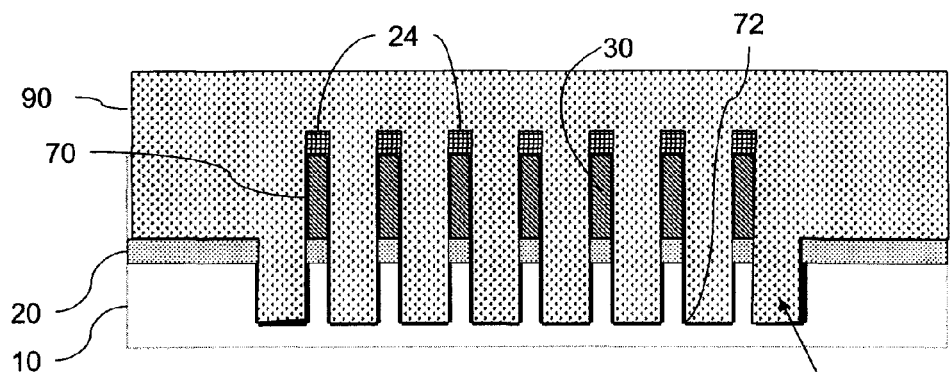
FIG. 9 is a schematic cross-sectional diagram of a partially completed capacitor according to the invention.
Figure 10:
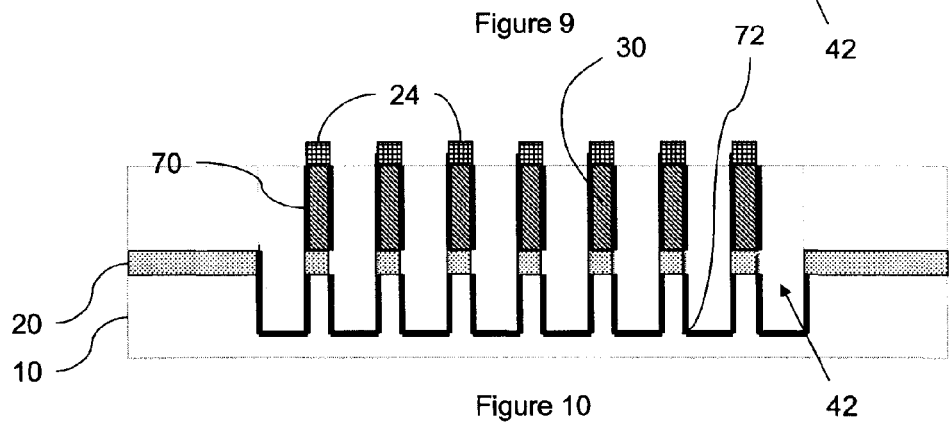
FIG. 10 is a schematic cross-sectional diagram of a partially completed capacitor according to the invention.
Figure 11:
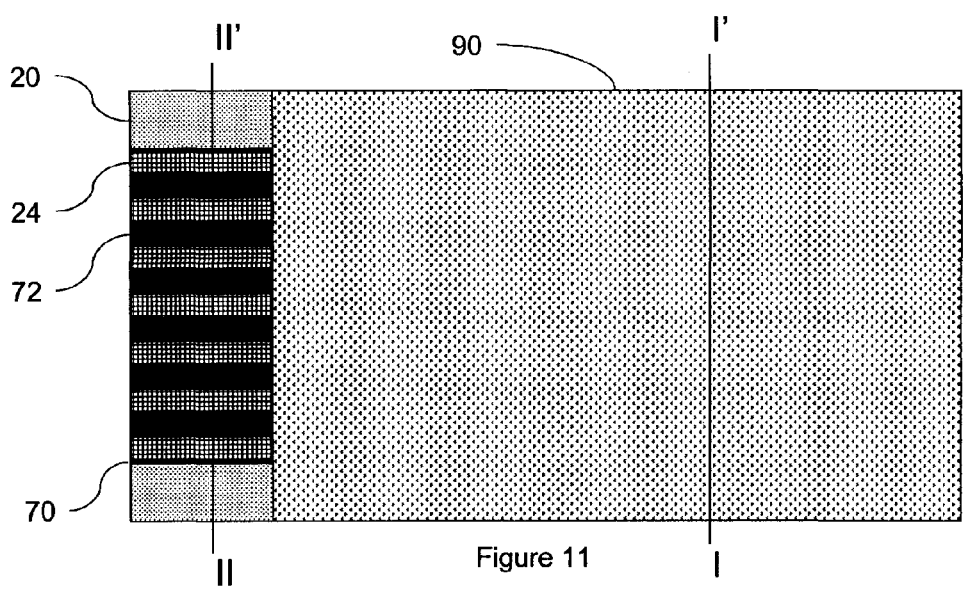
FIG. 11 is a schematic top-view diagram of a partially completed capacitor according to the invention.
Figure 12:
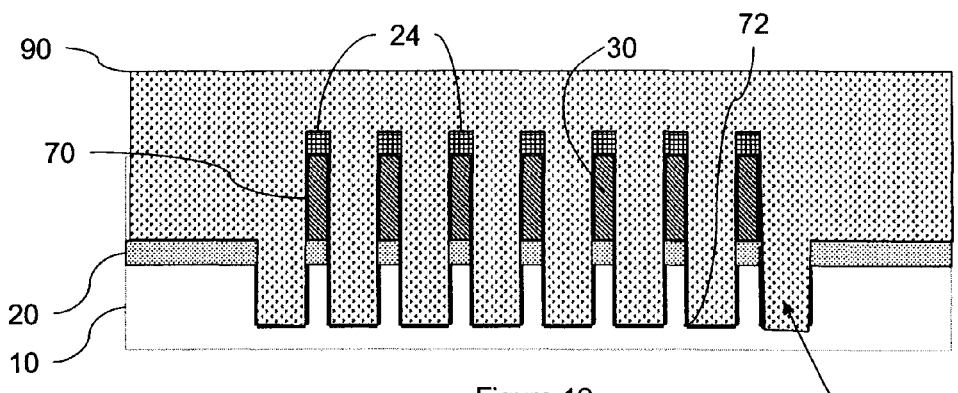
FIG. 12 is a schematic cross-sectional diagram of a partially completed capacitor according to the invention.
Figure 13:
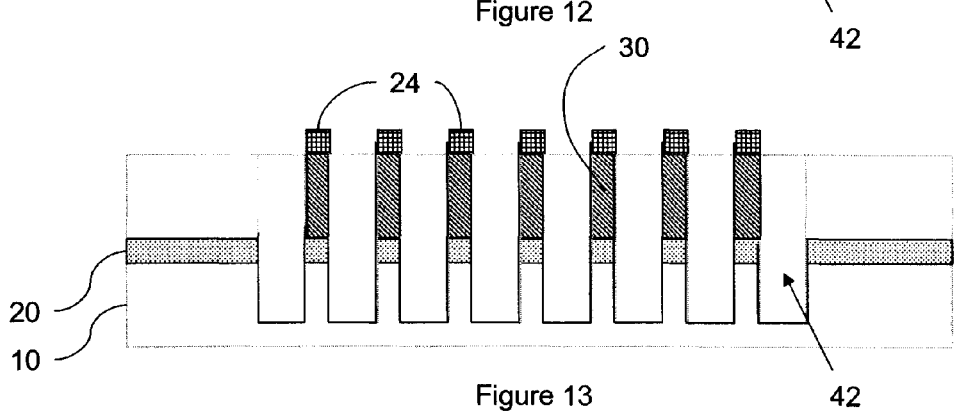
FIG. 13 is a schematic cross-sectional diagram of a partially completed capacitor according to the invention.
Figure 14:
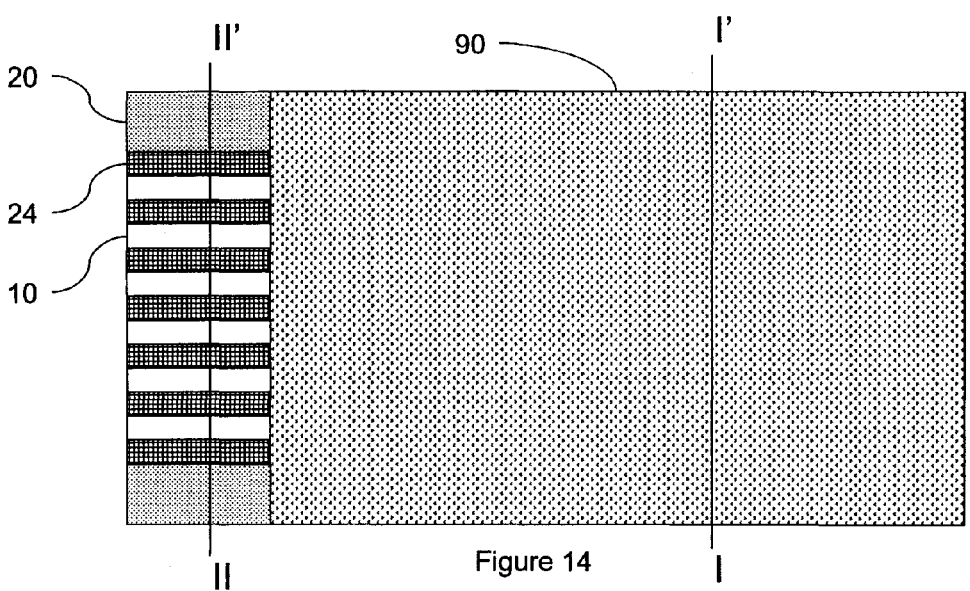
FIG. 14 is a schematic top-view diagram of a partially completed capacitor according to the invention.

In FIGS. 9–11, the invention utilizes a mask 90 to selectively remove portions of the insulators 70, 72. More specifically, FIG. 11 is a top-view, FIG. 9 is a cross-sectional view drawn along line I–I', while FIG. 10 is a cross-sectional view drawn along line II–II'. The mask 90 allows the portion of the structure shown in FIG. 10 to be exposed while the remaining portion shown in FIG. 9 is protected. Then, a material removal processes such as chemical etching, reactive-ion etching, heating, etc. is utilized to remove the exposed portions of the insulators 70, 72. The actual material removal process that will be used depends upon the specific type of material that was used for the insulators 70, 72. This results in the structures shown in FIGS. 12–14, where the insulators 70, 72 is no longer present in the cross-section II–II' of FIG. 14 (shown in FIG. 13) while the insulators 70, 72 is still present in the cross section I–I' of FIG. 14 (shown in FIG. 12).

Figure 35:
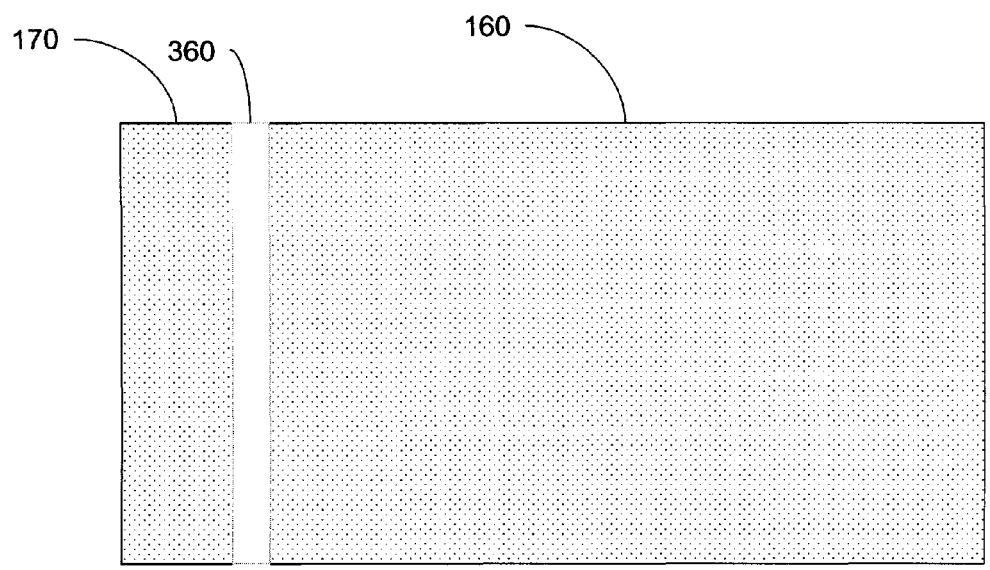
FIG. 35 is a schematic top-view diagram of a partially completed capacitor according to the invention.

The mask 90 is then removed and a conductor is patterned over the structure to form the top plate 160 and the bottom plate contact 170. Once again, FIG. 15 is a cross-sectional view alone line I–I' of FIG. 17, and FIG. 16 is a cross-sectional view along line II–II' of FIG. 17. As can be seen in the drawings, the bottom plate contact 170 electrically connects the fins 30 and the conductive substrate 10 because there is no insulator surrounding the fins 30 or the trenches 42 in the region where the bottom plate contact 170 is formed. To the contrary, the fins 30 and conductive substrate 10 are insulated from the top plate contact 160 by the insulators 70, 72 and the insulating layer 20. This capacitor structure will eventually be completed by depositing an insulator between the upper plate 160 and the bottom plate contact 170. For example, FIG. 35 illustrates an insulator 360 between the top plate 160 and the bottom plate contact 170. FIG. 17 also illustrates the control device 180 (such as a transistor, etc.) that allows selective access to the bottom line contact 170, for example, to store charge or read the charge within the memory capacitor.

Figure 21:
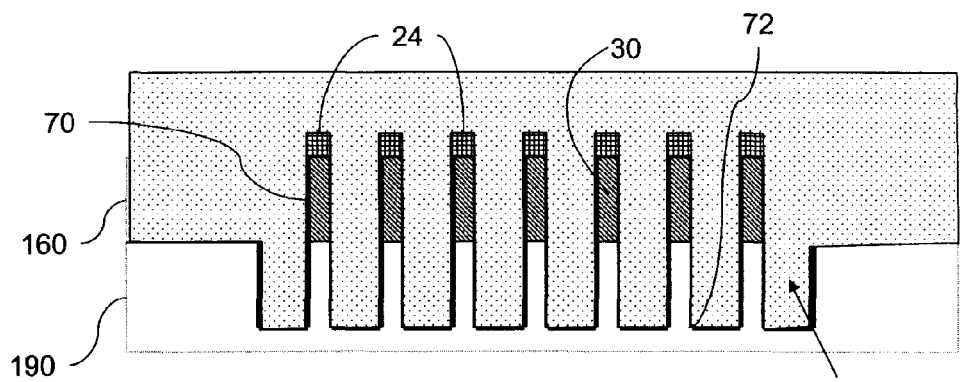
FIG. 21 is a schematic cross-sectional diagram of a partially completed capacitor according to the invention.
Figure 22:
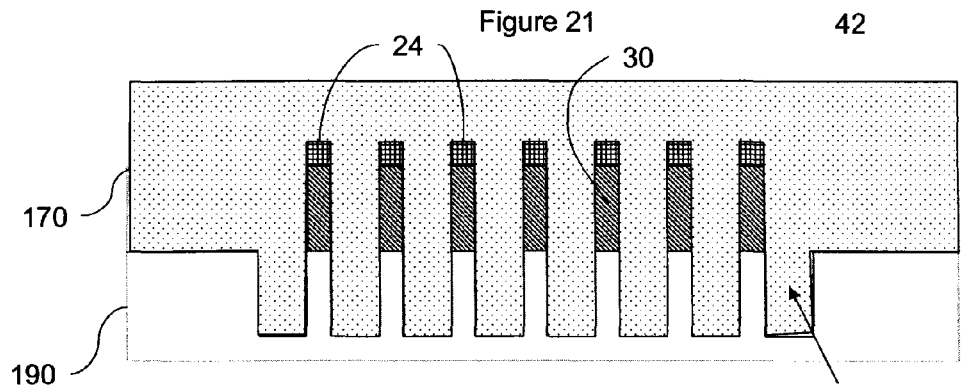
FIG. 22 is a schematic cross-sectional diagram of a partially completed capacitor according to the invention.
Figure 23:
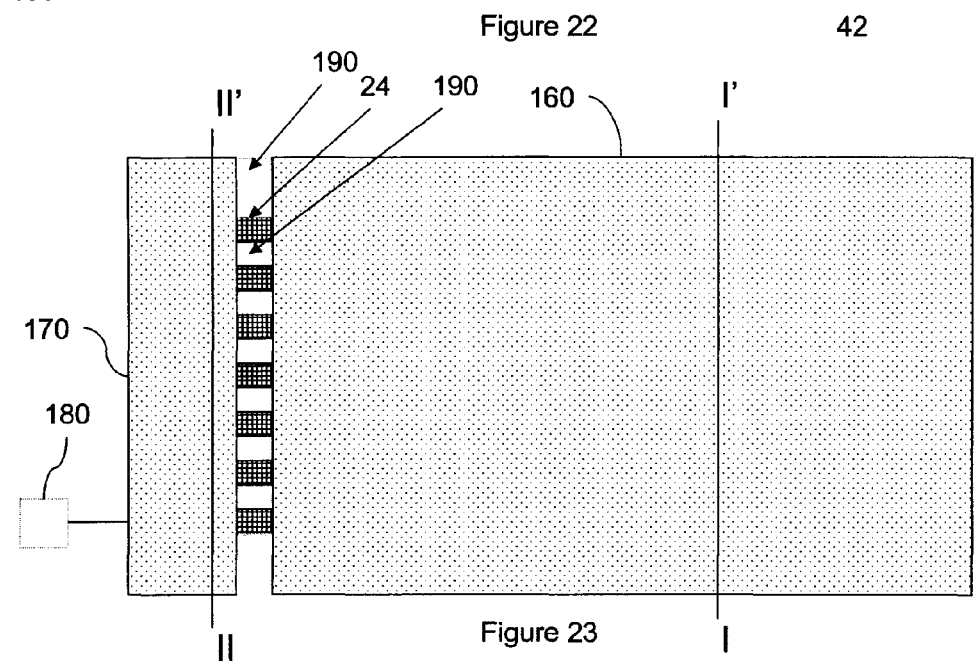
FIG. 23 is a schematic top-view diagram of a partially completed capacitor according to the invention.

FIGS. 18–23 illustrate another embodiment of the invention that is formed in the bulk area of the substrate, as opposed to the SOI structure shown in FIGS. 1–17. The processing shown in FIGS. 18–23 is somewhat similar to that shown in FIGS. 1–17 except that the insulator layer 20 is not utilized in the processing steps or structure shown in FIGS. 18–23. Instead, the invention begins by implanting the impurity 12 into a bulk substrate 190 (as opposed to the SOI substrate 10 that is discussed above). Then, the same conductor 22 and mask 24 described above in FIG. 23 are utilized to form the fins 30 in FIG. 20 as was done in FIG. 3, above. The same processing steps shown in FIGS. 4–17 are then used to complete the structure which results in the structure shown in FIGS. 21–23. More specifically, FIGS. 21–23 are substantially similar to FIGS. 15–17, except that in FIGS. 21–23 no insulator layer 20 is present. Further, in FIGS. 21–23 the substrate 190 is a bulk substrate. Otherwise, structure and processing shown are similar to those discussed above and a redundant discussion of the same as avoided.

Thus, as shown above, the invention can be formed in any type of common integrated structure, such as in the bulk portion of the integrated chip substrate (FIGS. 21–23) or in a silicon-on-insulator (SOI) type structure (FIGS. 15–17). In the SOI structure, the fins 30 extend from the insulator layer that covers the substrate 10 and can include conductive spacers on the fins 30 that electrically connect the fins 30 to the substrate 10. The insulator that covers the fins 30 and lines the trenches 42 can be separated by the SOI insulator layer and therefore this insulator comprises a first insulator portion lining the trenches 42 and a second insulator portion covering the fins 30. Also, the bottom plate contact is insulated from the top plate.

Figure 24:
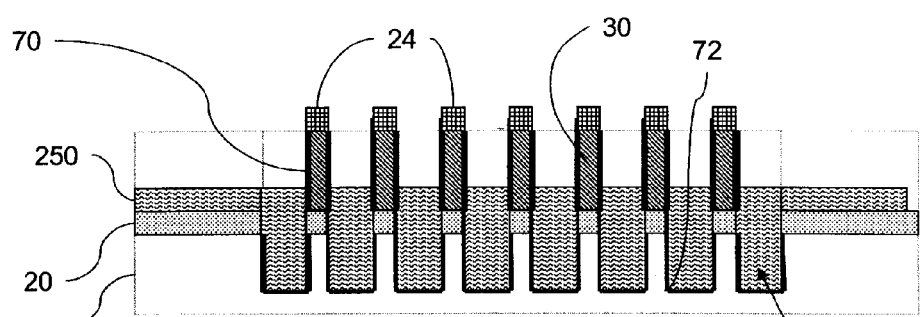
FIG. 24 is a schematic cross-sectional diagram of a partially completed capacitor according to the invention.
Figure 25:
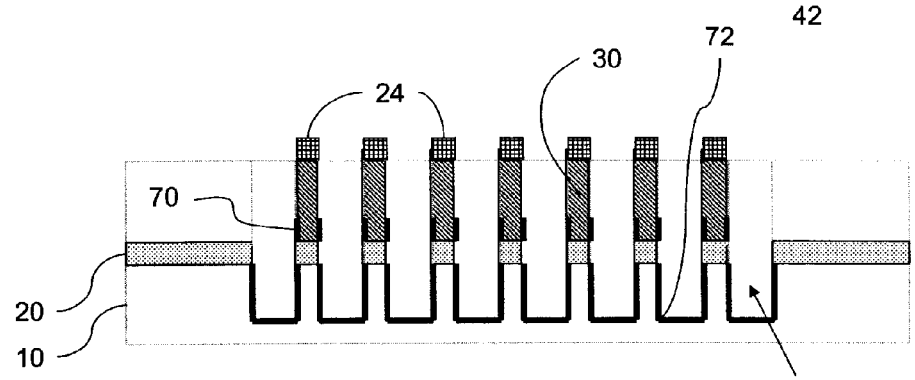
FIG. 25 is a schematic cross-sectional diagram of a partially completed capacitor according to the invention.

FIGS. 24–31 illustrate another embodiment of the invention. In the embodiment shown in FIGS. 24–31, a portion of the insulator 70 along sides of the fins 30 is intentionally removed to place the fins 30 in contact with the top plate 160. Therefore, in this embodiment, the lower plate comprises only the substrate 10 and does not utilize any part of the fins 30 as the lower plate. Instead, the fins 30 are used to pattern the trenches 42. As shown in FIG. 24, after the processing shown in FIGS. 7 and 8 are completed, a protective layer 250 is formed to protect the insulator 72 and potentially a portion of the insulator 70. Whether the entire insulator 70 is removed depends upon the specific implementation of the invention and whether the insulator layer 20 supplies a sufficient amount of insulation on its own. If it does not, some of the insulator 70 is left to remain on the lower portion of the fins 30. Then, with the protective layer 250 in place, the exposed portions of the insulator 70 are removed. Next, the protective material is removed resulting in the structure shown in FIG. 25.

Figure 26:
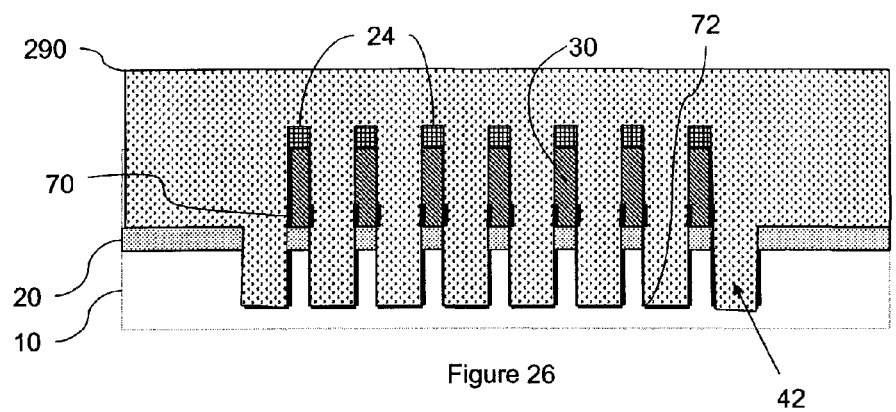
FIG. 26 is a schematic cross-sectional diagram of a partially completed capacitor according to the invention.
Figure 27:
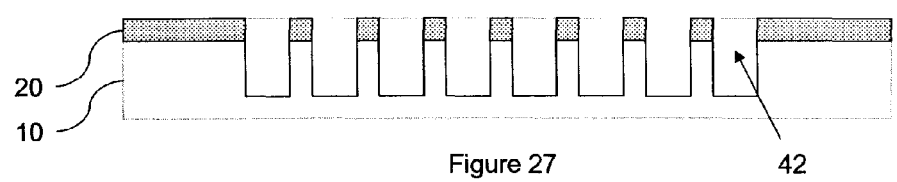
FIG. 27 is a schematic cross-sectional diagram of a partially completed capacitor according to the invention.
Figure 28:
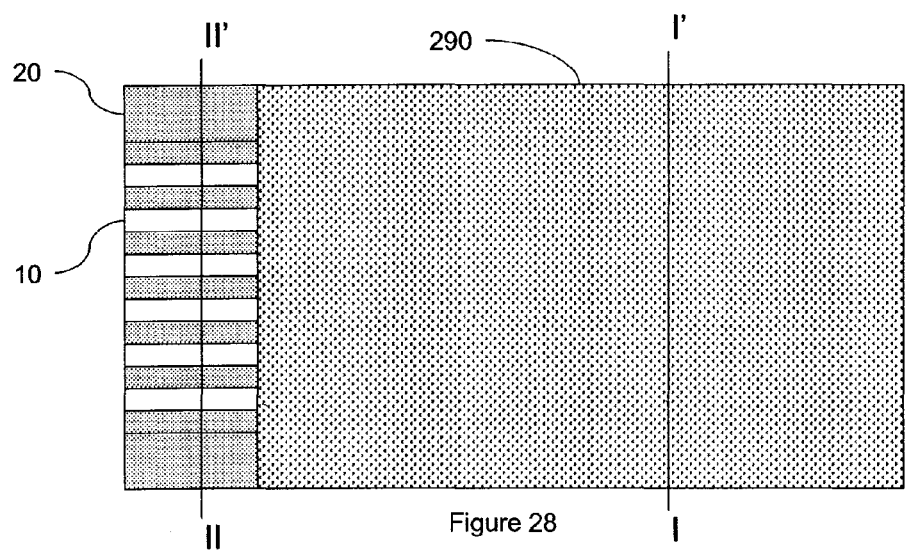
FIG. 28 is a schematic top-view diagram of a partially completed capacitor according to the invention.

Then, as shown in FIGS. 26–28, a mask 290 is formed which protects the region shown in FIG. 26 and allows the region shown in FIG. 27 to be exposed. Once again, as with the previous drawings, FIG. 26 is a cross-sectional view along line I–I' in FIG. 28, and FIG. 27 is a cross-sectional view along line II–II' in FIG. 28. With the mask 290 in place, the fins 30 are removed from the area not protected by the mask, as shown in FIG. 27. Once again, the specific material removal process will depend upon the material makeup of the fins 30 and can include etching, chemical processing, etc.

Figure 29:
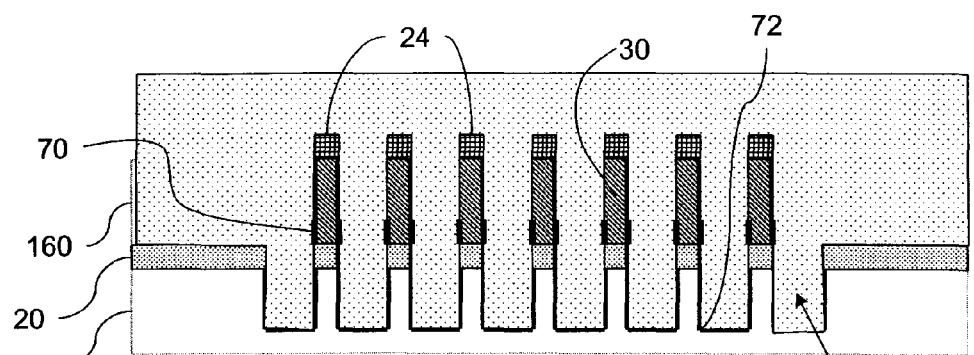
FIG. 29 is a schematic cross-sectional diagram of a partially completed capacitor according to the invention.
Figure 30:
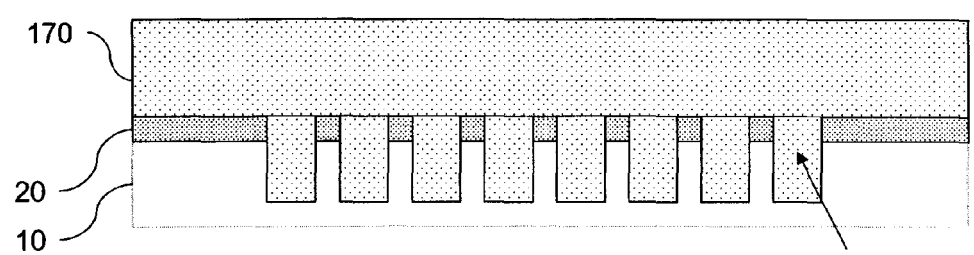
FIG. 30 is a schematic cross-sectional diagram of a partially completed capacitor according to the invention.
Figure 31:
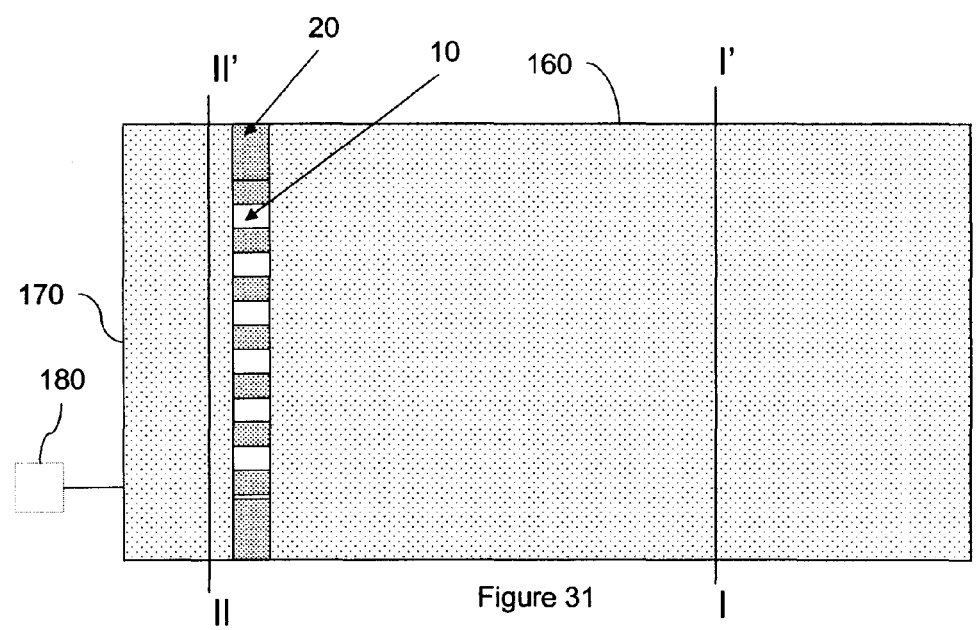
FIG. 31 is a schematic top-view diagram of a partially completed capacitor according to the invention.

The structure then undergoes the processing discussed above in FIGS. 15–17 to form the structure shown in FIGS. 29–31. Again, FIG. 29 is a cross-sectional view along line I–I' and FIG. 30 is a cross-sectional view along line II–II' of FIG. 31. Note that the bottom plate contact 170 is only in electrical contact with the substrate 10 because the fins have been removed in the processing shown in FIG. 27 from the area where the bottom plate contact 170 will be formed. Therefore, as discussed above, in this embodiment, only the substrate 10 is used for the bottom plate and the fins 30 are used to pattern the trenches 42.

Figure 32:
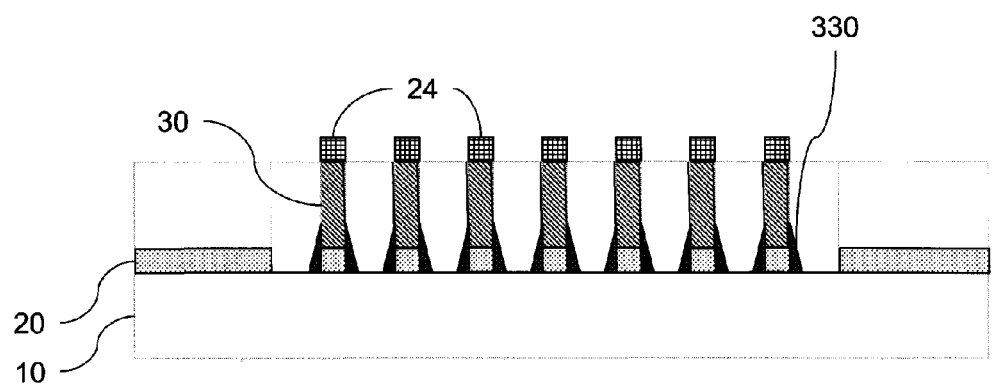
FIG. 32 is a schematic cross-sectional diagram of a partially completed capacitor according to the invention.
Figure 33:
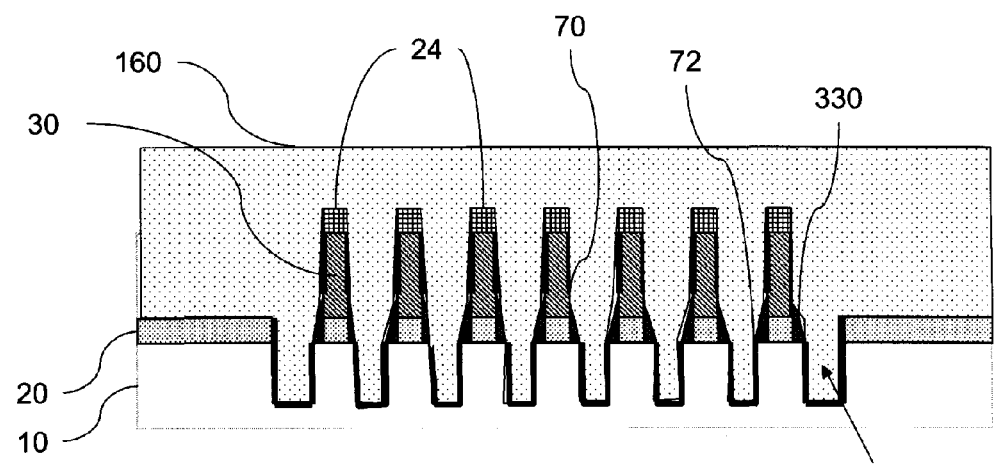
FIG. 33 is a schematic cross-sectional diagram of a partially completed capacitor according to the invention.
Figure 34:
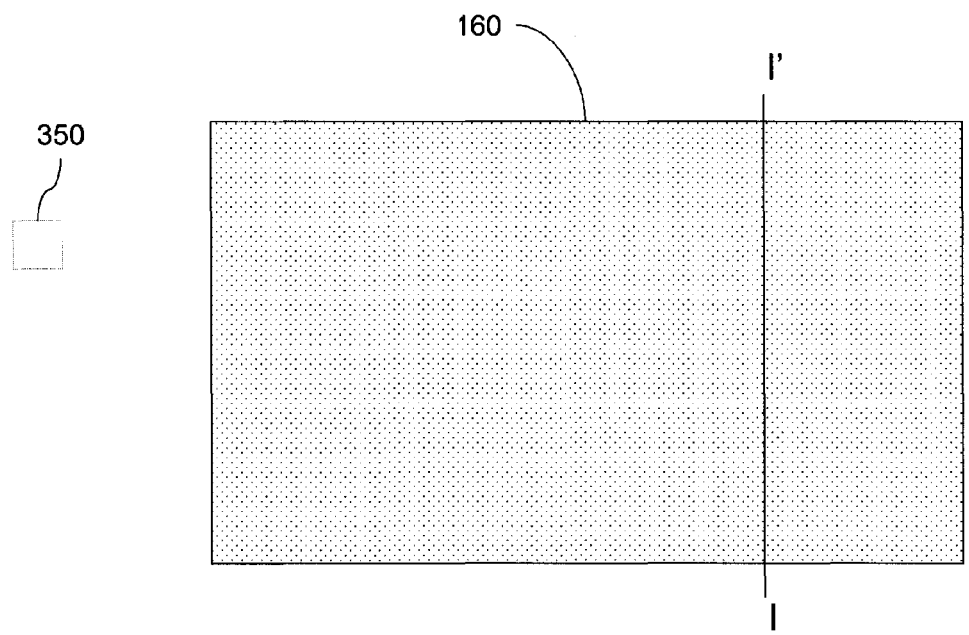
FIG. 34 is a schematic top-view diagram of a partially completed capacitor according to the invention.

FIGS. 32–34 illustrates another embodiment that avoids the need for a bottom plate contact. FIGS. 32 and 33 are cross-sectional views along line I–I' in FIG. 34. In this embodiment, conductive sidewall spacers 330 are formed as shown in FIG. 32 electrically connecting the substrate 10 and the fins 30. This processing is performed after the processing shown in FIG. 3. Many different processes can be used to form the sidewall spacers 330. For example, a conductive material can be deposited and then etched in a direction etch that removes material from horizontal surfaces faster than it removes material from vertical surfaces, which leaves the sidewall spacers 330 remaining on the lower portion of the fins. Then, the processing shown in FIGS. 4–17 would be performed, as discussed above, resulting in the structure shown in FIGS. 33 and 34. The processing is substantially similar to that discussed above, except that the bottom plate contact 170 does not need to be formed because the fins 30 and substrate 10 are electrically connected by the sidewall spacers 330. Therefore, in FIG. 34, only a contact to the substrate 350 is needed to make contact with the lower plate and only the upper plate 160 conductor is illustrated.

FIG. 35 can be used with any of the previous embodiments and illustrates the insulator 360 that will eventually cover the bottom plate contact, upper plate, as well as any of the other contacts formed with the invention.

Figure 36:
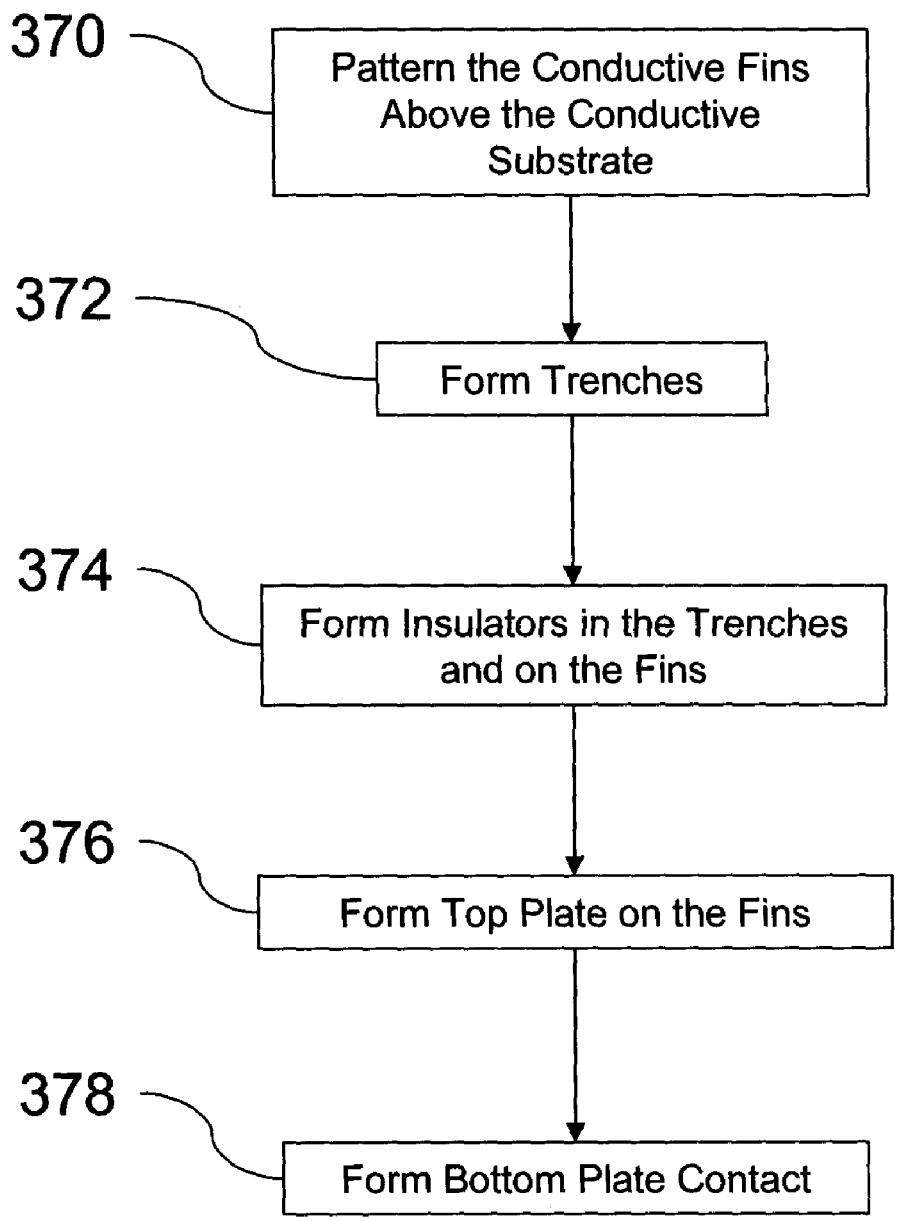
FIG. 36 is a flow diagram illustrating a preferred method of the invention.

As shown in flowchart form in FIG. 36, this structure is formed using one or more methods that pattern the conductive fins above the conductive substrate 370 (e.g., on the doped bulk substrate or on the insulator layer of an SOI structure). The invention then forms trenches 372 that extend into the substrate between locations where the fins extend above the substrate. One or more insulators are then formed in the trenches and on the fins in item 374. The conductive top plate is then formed on the fins and to fill the trenches in item 376. The bottom plate contact can be formed (378) at the same time (or later) and the bottom plate contact electrically connects the fins and the substrate to form a bottom plate of the capacitor structure. In SOI structures, the invention can also form conductive spacers on the fins to electrically connect the fins to the substrate. When forming the fins, the invention patterns an insulating mask on a conductive layer and then patterns the conductive fins through the insulating mask. The mask remains as a permanent part of the structure and helps to insulate the fins from the overlying top plate.

The invention provides a new type of capacitor (e.g., memory capacitor such as a DRAM capacitor) that is substantially smaller, faster, and less-expensive to manufacture than conventional capacitors. In addition, the invention offers a substantial increase in capacitor surface area, which dramatically increases the capacitance of the capacitor. The invention can thus be produced at a lower cost, and can provide a higher density of memory capacitors. The invention can also use a lower the power consumption of the memory array. Further, this improved structure performs at a higher speed, and can produce a soft error rate improvement.

While the invention has been described in terms of preferred embodiments, those skilled in the art will recognize that the invention can be practiced with modification within the spirit and scope of the appended claims.

What is claimed is:

1. A capacitor structure comprising:
   a conductive substrate;
   a plurality of conductive fins extending above said substrate;
   a plurality of trenches extending into said substrate, wherein said trenches are positioned between locations where said fins extend above said substrate;
   an insulator in said trenches;
   a conductive top plate covering said fins and filling said trenches; and
   a bottom plate contact connected to said substrate.

2. The structure in claim 1, further comprising an insulator layer between said substrate and said fins, wherein said substrate comprises a bottom plate of said capacitor structure, and said fins are electrically isolated from said substrate by said insulator layer.

3. The structure in claim 1, further comprising a second insulator covering said fins, wherein said bottom plate contact is also connected to said fins, and said fins and said substrate comprise a bottom plate of said capacitor structure.

4. The structure in claim 3, further comprising:
   an insulator layer between said substrate and said fins; and
   conductive spacers on said fins electrically connecting said fins to said substrate.

5. The structure in claim 3, wherein said insulator comprises a first insulator lining said trenches and a second insulator covering said fins.

6. The structure in claim 1, further comprising an insulating mask above the each of said fins.

7. The structure in claim 1, wherein said bottom plate contact is insulated from said top plate.

8. A capacitor structure comprising:
   a conductive substrate;
   a plurality of conductive fins extending above said substrate;
   a plurality of trenches extending into said substrate, wherein said trenches are positioned between locations where said fins extend above said substrate;
   an insulator in said trenches and covering said fins;
   a conductive top plate covering said fins and filling said trenches; and
   a bottom plate contact connected to said fins and said substrate.

9. The structure in claim 8, wherein said fins and said substrate comprise a bottom plate of said capacitor structure.

10. The structure in claim 8, further comprising an insulator layer between said substrate and said fins.

11. The structure in claim 10, further comprising conductive spacers on said fins electrically connecting said fins to said substrate.

12. The structure in claim 8, further comprising an insulating mask above the each of said fins.

13. The structure in claim 8, wherein said insulator comprises a first insulator lining said trenches and a second insulator covering said fins.

14. The structure in claim 8, wherein said bottom plate contact is insulated from said top plate.

15. A method of forming a capacitor structure comprising:
   patterning a plurality of conductive fins above a conductive substrate;
   forming a plurality of trenches extending into said substrate between locations where said fins extend above said substrate;
   forming an insulator in said trenches and on said fins;
   forming a conductive top plate on said fins and in said trenches; and
   forming a bottom plate contact connected to said fins and said substrate.

16. The method in claim 15, wherein said process of forming said bottom plate contact electrically connects said fins and said substrate to form a bottom plate of said capacitor structure.

17. The method in claim 15, further comprising, before patterning said conductive fins, forming an insulator layer above said substrate, wherein said fins are formed on said insulator layer.

18. The method in claim 17, further comprising forming conductive spacers on said fins electrically connecting said fins to said substrate.

19. The method in claim 15, wherein said process of patterning said conductive fins comprises:
   forming a conductor layer above said substrate;
   patterning an insulating mask on said conductive layer; and
   patterning said conductive fins through said insulating mask.

20. The method in claim 15, wherein said process of forming said insulator forms a first insulator lining said trenches and a second insulator covering said fins.

21. The method in claim 15, wherein said process of forming said bottom plate contact electrically insulates said bottom plate from said top plate.

22. A method of forming a capacitor structure comprising:
   patterning a plurality of conductive fins above a conductive substrate;

forming a plurality of trenches extending into said substrate between locations where said fins extend above said substrate;

forming an insulator in said trenches and on said fins;

forming a conductive top plate on said fins and in said trenches; and forming a bottom plate contact connected to said substrate.

23. The method in claim 22, wherein said process of forming said bottom plate contact electrically connects said fins and said substrate to form a bottom plate of said capacitor structure.

24. The method in claim 22, further comprising, before patterning said conductive fins, forming an insulator layer above said substrate, wherein said fins are formed on said insulator layer.

25. The method in claim 24, wherein said substrate comprises a bottom plate of said capacitor structure, and said fins are electrically isolated from said substrate by said insulator layer.

26. The method in claim 24, further comprising forming conductive spacers on said fins electrically connecting said fins to said substrate.

27. The method in claim 22, wherein said process of patterning said conductive fins comprises:

forming a conductor layer above said substrate;

patterning an insulating mask on said conductive layer; and patterning said conductive fins through said insulating mask.

28. The method in claim 22, wherein said process of forming said insulator forms a first insulator lining said trenches and a second insulator covering said fins.

29. The method in claim 22, wherein said process of forming said bottom plate contact electrically insulates said bottom plate from said top plate.

* * * * *